(12) United States Patent
Kragl et al.

(10) Patent No.: US 6,717,060 B2
(45) Date of Patent: Apr. 6, 2004

(54) CIRCUIT BOARD CONSISTING OF AT LEAST TWO INDIVIDUAL CIRCUIT BOARD LAYERS MADE OF PLASTIC

(75) Inventors: Hans Kragl, Diekholzen (DE); Rolf Hohmann, Bad Salzdetfurth (DE)

(73) Assignee: Harting Elektro-optische Bauteile GmbH & Co. KG (DE)

( * ) Notice: Subject to any disclaimer, the term of this patent is extended or adjusted under 35 U.S.C. 154(b) by 0 days.

(21) Appl. No.: 09/854,779

(22) Filed: May 14, 2001

(65) Prior Publication Data

US 2002/0011349 A1 Jan. 31, 2002

(30) Foreign Application Priority Data

May 15, 2000 (DE) .......................................... 100 23 736

(51) Int. Cl.⁷ ................................................. H05K 1/03
(52) U.S. Cl. ........................ 174/255; 174/254; 174/260
(58) Field of Search ................................. 174/254, 260, 174/255; 361/747, 750, 751, 767, 769, 789, 816; 439/77, 67

(56) References Cited

U.S. PATENT DOCUMENTS

| | | | |
|---|---|---|---|
| 3,398,232 A | | 8/1968 | Hoffman |
| 4,591,220 A | | 5/1986 | Impey |
| 4,604,799 A | | 8/1986 | Gurol |
| 4,606,787 A | | 8/1986 | Pelligrino |
| 4,734,315 A | | 3/1988 | Spence-Bate |
| 5,142,441 A | | 8/1992 | Seibold et al. |
| 5,207,887 A | * | 5/1993 | Crumly et al. ................. 205/78 |
| 5,354,205 A | * | 10/1994 | Feigenbaum et al. |
| 5,666,272 A | * | 9/1997 | Moore et al. ................ 361/735 |
| 5,764,119 A | | 6/1998 | Miyagi et al. |
| 5,825,630 A | * | 10/1998 | Taylor et al. ................ 361/790 |
| 5,914,534 A | | 6/1999 | Todd et al. |
| 6,007,669 A | * | 12/1999 | Crumly et al. ............ 156/303.1 |
| 6,188,028 B1 | * | 2/2001 | Haba et al. |
| 6,313,411 B1 | * | 11/2001 | Budnaitis |
| 6,392,165 B1 | * | 5/2002 | Liao ............................ 174/262 |
| 6,434,819 B1 | * | 8/2002 | Rokugawa .................... 29/852 |
| 6,490,168 B1 | * | 12/2002 | Rochowicz et al. ......... 361/784 |

FOREIGN PATENT DOCUMENTS

| | | |
|---|---|---|
| DE | 196 01 202 A1 | 3/1997 |
| DE | 198 38 519 A1 | 3/2000 |
| EP | 0158876 | 10/1985 |
| EP | 0463297 | 1/1992 |
| EP | 0 645 953 A1 | 3/1995 |
| EP | 0 801 433 A1 | 10/1997 |
| GB | 2 266 410 A | 10/1993 |
| JP | 07170077 | 7/1995 |
| JP | 07 170077 A | 7/1995 |
| WO | WO 92/15408 | 9/1992 |

* cited by examiner

*Primary Examiner*—Evan Pert
*Assistant Examiner*—Jeremy Norris
(74) *Attorney, Agent, or Firm*—Cook, Alex, McFarron, Manzo, Cummings & Mehler, Ltd.

(57) ABSTRACT

A circuit board (5) is described, consisting of at least two individual circuit board layers (10) made of plastics and produced by formation technique, which each have first and second functional sides and at least one microstructured positioning formation (16) on each of the first and second functional sides and at least one microstructured conductor trench (12) on one of the functional sides, the conductor trench (12) being provided with a metallization (18). This allows a low expenditure production of circuit boards having a high packing density.

24 Claims, 7 Drawing Sheets

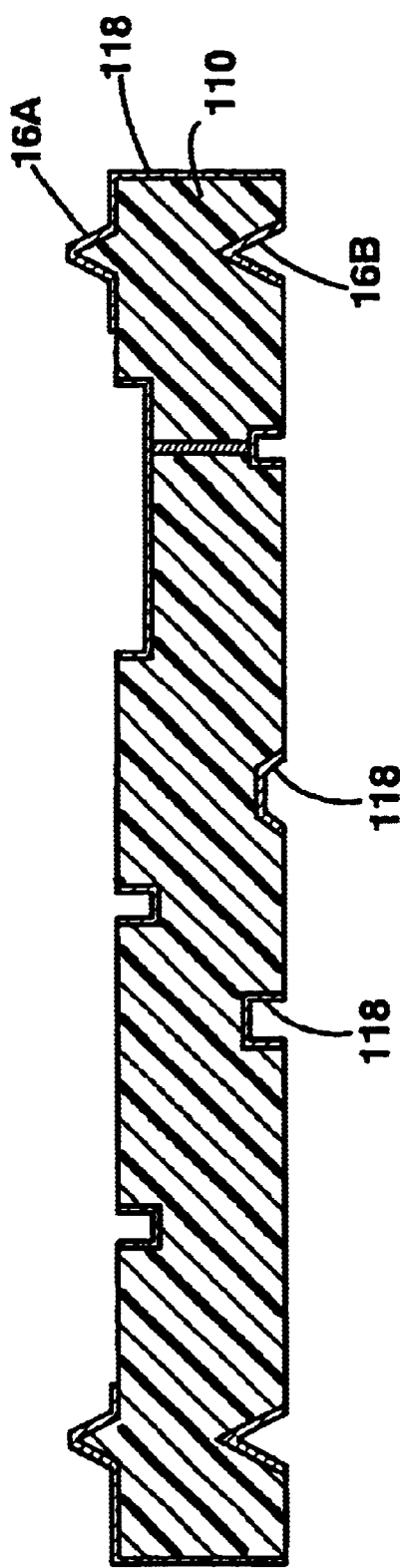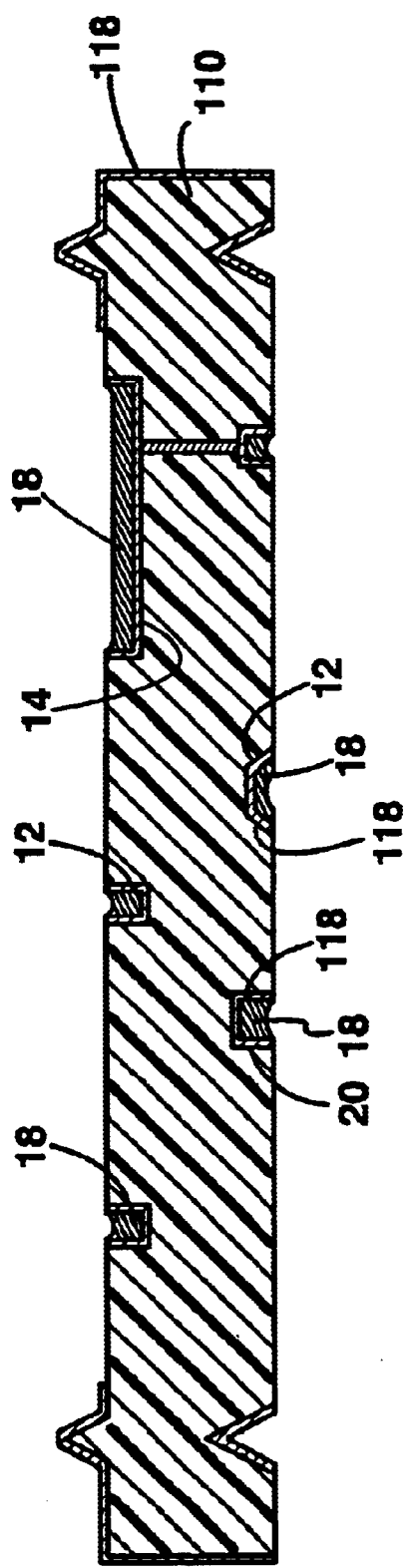

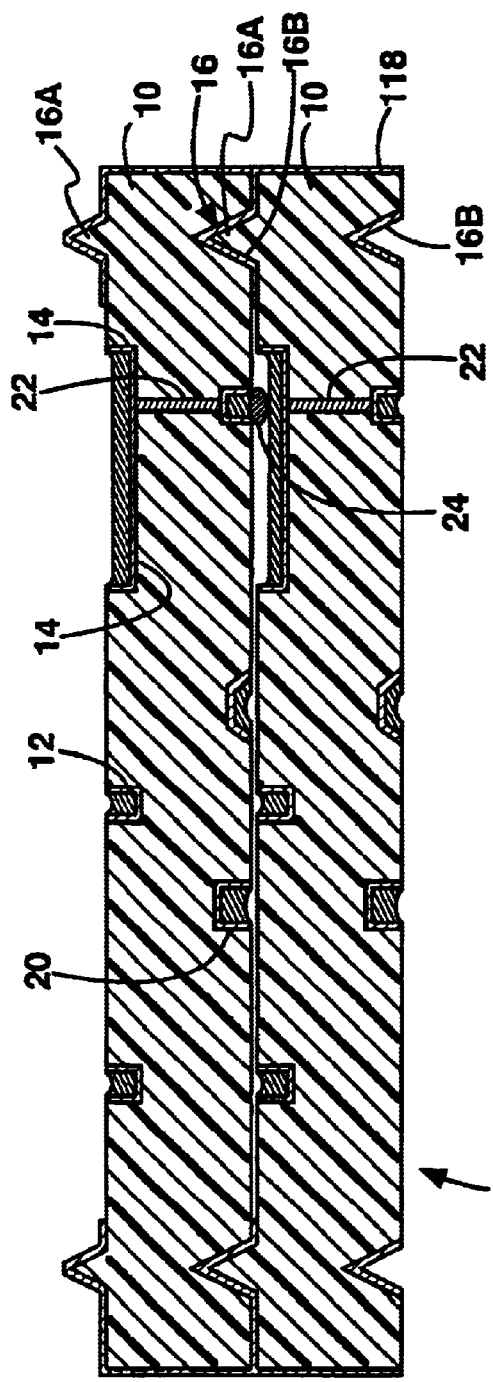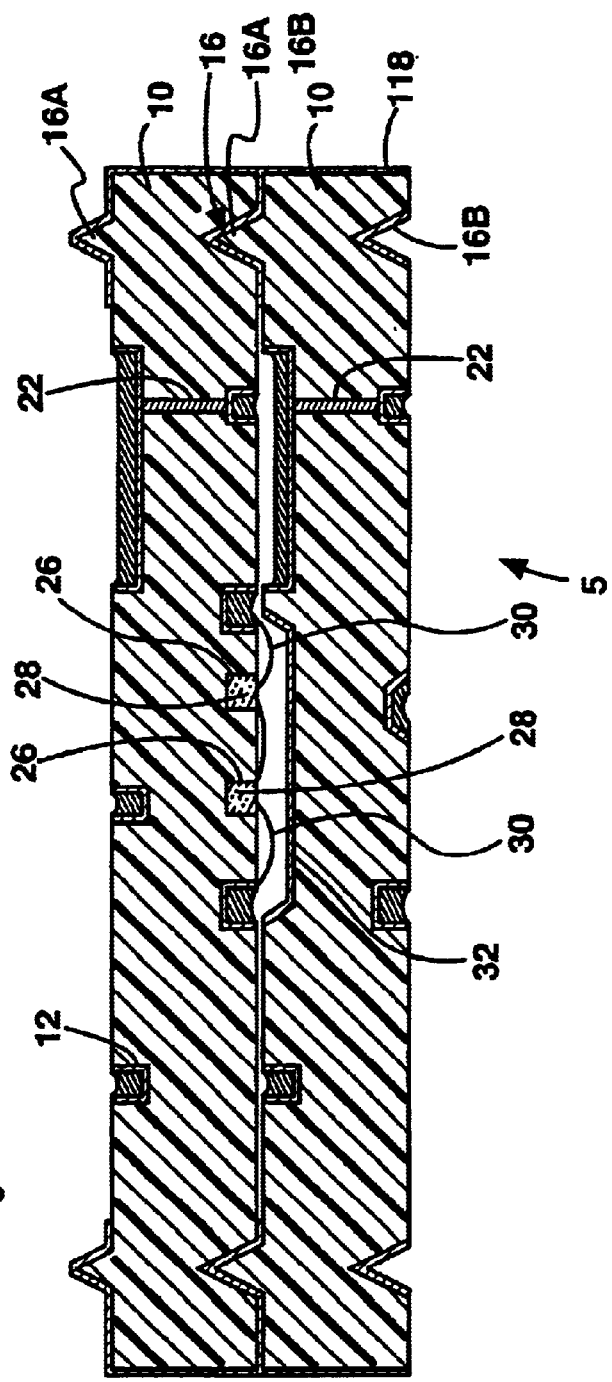

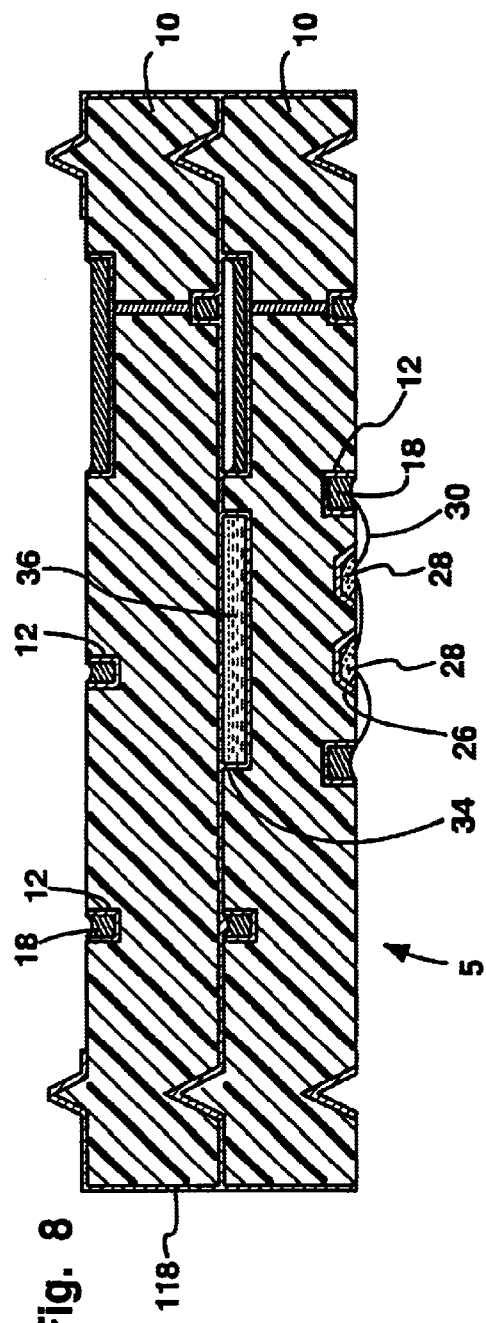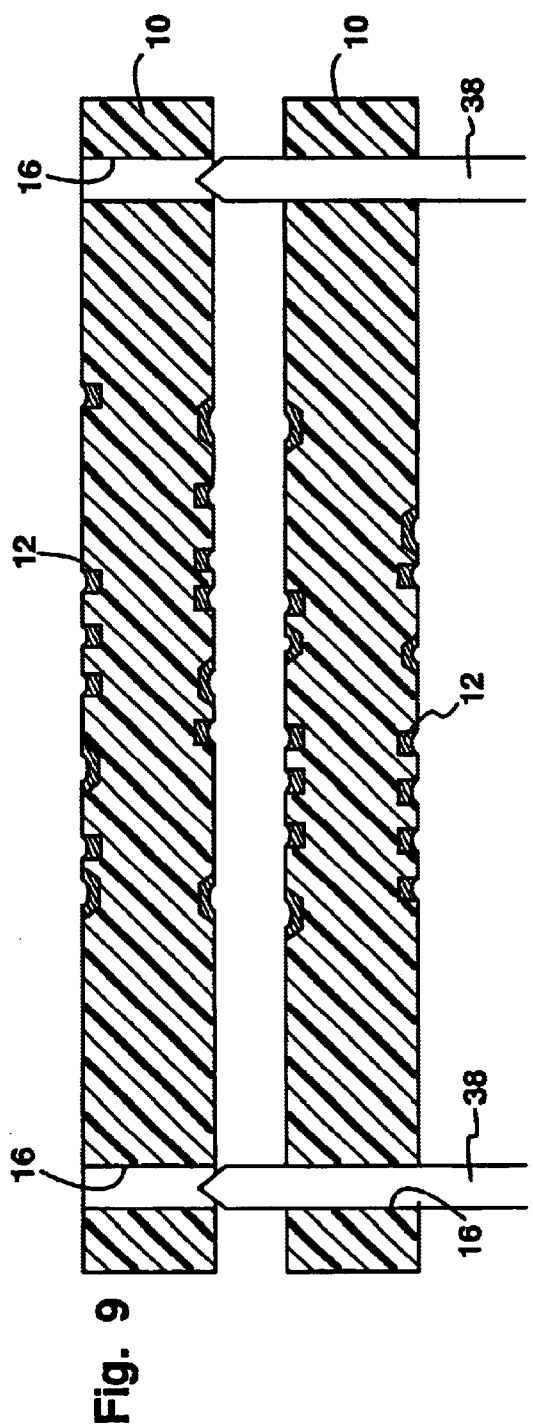

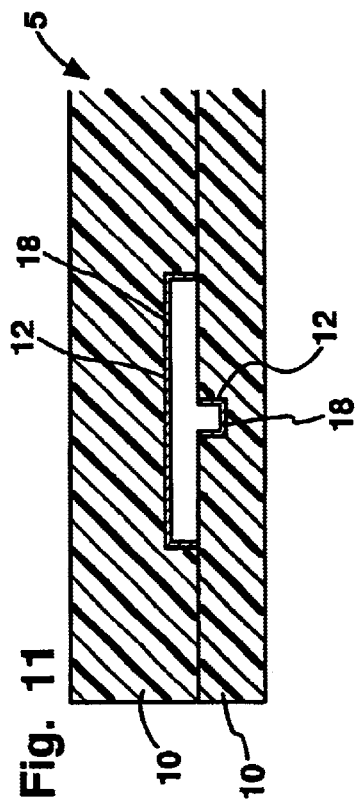
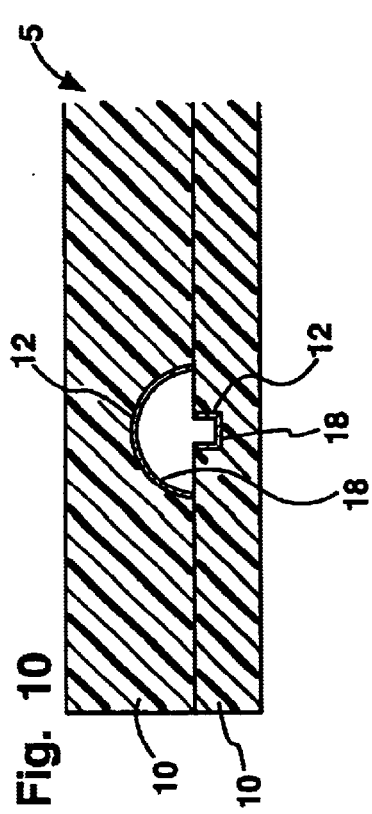

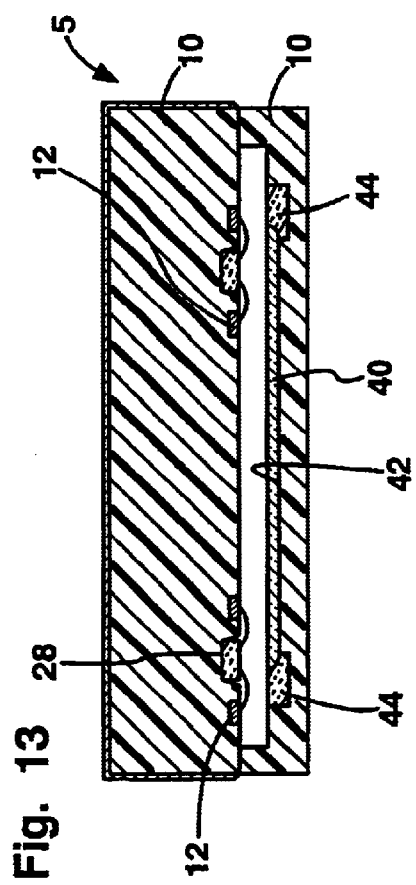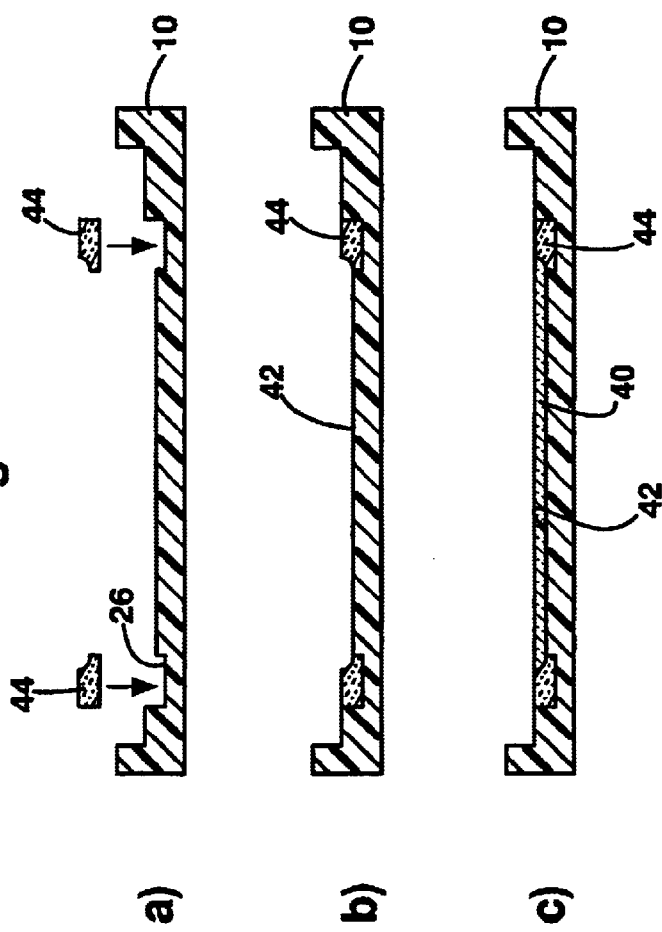

CIRCUIT BOARD CONSISTING OF AT LEAST TWO INDIVIDUAL CIRCUIT BOARD LAYERS MADE OF PLASTIC

The invention relates to a circuit board and a method of manufacturing a circuit board.

Circuit boards are currently manufactured by laminating a plurality of two-sided photolithographically structured individual layers precisely onto each other. The starting material for the single layers is a reinforced or non-reinforced film or sheet of epoxy resin material which in general is already provided with a thin copper layer as a semi-finished product in a nonstructured form. Since the contact vias are produced after laminating by making bore holes, the individual layers have to be layered very precisely on top of each other, for a drilling tool to reliably hit the contacts to be connected. As an alternative, bore holes which are produced with the required high precision and in correct alignment in relation to the conductor tracks may also be used as positioning formations. However, since this is necessary for each individual layer with very high precision and, hence, great expenditure, the manufacturing of circuit boards is expensive.

In this technology, components may be mounted only on the upper side or on the underside of the multi-layer circuit board. The components may be active semiconductor components provided with a package or in the form of a chip, or passive components. Such components are not suitable for being mounted on the inner layers of the circuit board since it is not possible to provide space between the layers, such as in the form of an accommodation opening. There is therefore an increase in the wiring expenditure, and intermediate layers additionally required make the circuit board more expensive and result in an increase in its complexity and size.

In modern circuit boards a radio-frequency line is realized on a layer level by two electric single conductors extending in parallel. The electric field is necessarily led between the two conductors in the circuit board material. Because of its dielectric material properties, the circuit board material is thereby given a substantial influence on the transmission properties of the RF line. As frequencies increase, standard materials such as FR4 are no longer suitable, which is why ceramic substrates or fluorinated plastics (Teflon) are utilized, which are then suitable up to higher frequencies. But these materials are expensive and have likewise a maximum frequency beyond which the RF line, due to its material, is damped too strongly.

In conventional circuit boards it would also be possible to integrate optical intermediate layers with dielectric waveguides. However, for coupling the light in and out, a precise positioning has to be performed between the different layers. This is not feasible since the starting material is plate-shaped and non-structured and the structuring of the copper foil is not suitable for positioning semiconductor chips and plates in relation to each other.

For dissipating large amounts of lost heat the known circuit boards could also be provided with an integrated fluidic cooling system. The cooling channels, however, need to be manufactured in separate operations, which makes the circuit board expensive.

With the increase in the clock rate of the information processing systems in which the prior circuit boards are employed there is also an increase in the demands made on the compactness of the circuit board, the transmission frequency of the RF conductors, the thermal power loss to be dissipated, and the precision of the electric conductors. In addition, a need will arise to integrate optical lightguides into the circuit board, it being required to be possible to couple light in and out at low expenditure. It is a disadvantage of the prior known circuit boards that an improvement in the RF behavior, an integration of optical waveguides and fluidic cooling systems as well as an increase in the packing density is possible only at an extremely high expenditure.

The object of the present invention consists in providing a circuit board which creates the prerequisites for a high packing density, good RF conduction, a cooling system adapted to be designed in a simple manner, and the use of optical waveguides.

This object is achieved by a circuit board consisting of at least two individual circuit board layers made of plastics and produced by formation technique, which each have first and second functional sides and at least one microstructured positioning formation on the first and second functional sides and at least one microstructured conductor trench on one of the functional sides, the conductor trench being provided with a metallization. By use of a formation of molding process, in particular an injection molding process, for producing the individual layers, the formations required for the desired functions of the circuit board may be configured at low expense and with maximum precision already during the manufacture of the individual layers; there is no need for a subsequent machining step such as a finishing cutting operation, in order to configure geometric structures with a high positional accuracy. Since the positioning formations are also formed already during the production of the individual layers, the arrangement thereof in relation to microstructures arranged on the functional sides and having specific functions is predefined precisely, so that all of the microstructures of the individual layer will then later be in precise alignment with respect to each other.

According to one embodiment of the invention, protrusions and depressions which are pyramid-shaped, for example, may be used for the positioning formations. When the individual layers are placed on top of each other to form the circuit board, the protrusions of the one individual layer engage into the depressions of the other individual layer, so that an automatic alignment of the individual layers results in relation to each other.

In accordance with an alternative embodiment of the invention the positioning formations may be in the form of openings which extend from the one functional side through the individual layer and as far as to the other functional side. A positioning pin may then be passed through these openings, so that the individual layers are precisely positioned in relation to each other.

According to one embodiment of the invention, provision is made that the conductor trench extends as far as to the edge of the circuit board, so that a plug connector may be connected. This plug connector may either be slipped onto the entire circuit board or, if this turns out to be expedient, only onto some of the individual layers, which are provided for this purpose with a connection protrusion projecting from the circuit board; the respective conductor trenches then extend as far as onto the connection protrusion.

For obtaining an RF line, in accordance with one embodiment of the invention a first conductor trench is provided on one of the individual layers and a second conductor trench is provided on the other individual layer, the two conductor trenches being located centered opposite each other and one of the conductor trenches having smaller dimensions than the other conductor trench. The conductor trench having the larger dimensions may be semicircular or rectangular in cross-section, for example, so that it bridges over the conductor trench having the smaller dimensions, the space between the conductor trenches located opposite each other being filled with air. In this way an RF conductor is formed which is arranged "between" the individual layers of the circuit board. The electric and magnetic alternating field is guided in the enclosed cavity of air, so that the material properties of the plastics of the individual layers have no influence on the RF line.

For cooling the circuit board, in accordance with one embodiment of the invention a cooling groove is provided on at least one of the individual layers, the cooling groove being filled with a metallization of a thickness such that a heat sink is formed. Such heat sink allows dissipating the thermal loss from components mounted on the circuit board by thermal conduction.

For cooling the circuit board, in accordance with another embodiment of the invention a cooling channel may be provided on at least one of the individual layers, the cooling channel being adapted for a cooling agent to be conducted therethrough, the other individual layer covering the cooling channel. The cooling channel, too, presents a microstructure which can be designed without much expenditure during formation of the individual layer. By means of the cooling channel an active cooling of the circuit board can be achieved, whereby even very large thermal losses may be dissipated.

The cooling channel preferably extends as far as to the edge of the circuit board, a connection for the cooling agent being formed on the circuit board. By means of the connection for the cooling agent the cooling channel may be connected in a simple manner to an external cooling device which ensures the cooling agent supply.

According to a further preferred embodiment of the invention, at least one mount for an electronic, optical or optoelectronic component is provided in at least one of the individual layers. The mount likewise presents a microstructure which may be simply formed with high accuracy during production, so that the components may be arranged at exactly the right place in the interior of the circuit board, which reduces the expenditure for connecting the components. If required, a recess located opposite the mount may be provided in the other individual layer. This recess ensures, for example, the prevention of damage to the bonding wires used for connecting the component.

The individual layers of the circuit board may be connected with each other by an electrically conductive material such as, e.g., by an electrically conductive adhesive. This allows a contacting of conductor trenches which are arranged on different circuit boards. For the contacting of conductor trenches which are arranged on functional sides, facing away from each other, of the individual layers, contact openings may be used which extend from the first functional side of an individual layer through the layer and as far as to the second functional side and are filled with an electrically conductive material.

In accordance with a further preferred embodiment of the invention, provision is made that at least one of the individual layers consists of an optically transparent material and that on this individual layer a waveguide trench is provided which is filled with an optically transparent material the refractive index of which suitably differs from that of the material of the individual layer, so that a waveguide is formed. The microstructure of the individual layer required for the manufacture of the waveguide may also be produced at low expense during formation of the individual layers. Thereafter, it is merely necessary to introduce a suitable material into the waveguide trench. Optoelectronic components adapted for being suitably arranged in the mounts of the individual layers can then cooperate with the waveguide. Owing to the precise arrangement of the mounts in relation to the waveguide, it is possible to reliably achieve good optical coupling between the components arranged in the mounts and the waveguide.

Preferably, provision is made that the individual layer provided with the waveguide comprises a mirror by means of which light may be coupled into and out of the waveguide. This allows the use of an optoelectronic component which radiates light in a direction perpendicular to the plane in which the waveguide extends.

It is preferably provided that the mirror is a separate component which is inserted in the individual layer. This reduces production costs since the mirror and the individual layer may be produced independently from each other.

The above-mentioned object is further achieved by a method of manufacturing a circuit board, comprising the following steps: first at least two individual layer blanks are produced by formation from a casting of molding process, each of the blanks being provided with positioning formation preforms on first and second functional sides. The individual layer blanks are then subjected to a pretreatment on their entire surface such that they can be provided with a metallization. The pretreatment may consist, for example, in that a thin pre-metallization is applied or the substrate is seed-injected. In those regions which are not intended to be provided with a metallization, the surface is subjected to a subsequent treatment, so that no metallization is deposited in these regions. The subsequent treatment may consist, for example, in that the pre-metallization is taken away mechanically or the seeding is removed chemically. Subsequently, a metallization is applied to the regions which have not been subjected to a subsequent treatment. It is in this way that the conducting tracks are formed on the printed circuit board. Finally, the individual layer blanks are placed on top of one another and at the same time precisely positioned in relation to each other by means of the positioning formations. The basic principle is to spend the high expenditure which is required for achieving the required precision only one time, namely on producing the mold from which the individual layers are formed. If this mold has been produced with the required accuracy, the desired geometric microstructures such as the positioning formations, the mounts for components as well as the cooling channels may be formed without any further large expenditure.

Advantageous designs of the invention will be apparent from the subclaims.

The invention will be described hereinafter with reference to various embodiments illustrated in the appended drawings. In the drawings:

FIG. 4 shows the individual layer blank of FIG. 3 in a second machining condition;

FIG. 5 shows an individual circuit board layer which is used in the circuit board of FIG. 1;

FIG. 6 shows an embodiment of a circuit board according to the invention, in cross-section;

FIG. 7 shows a second embodiment of a circuit board according to the invention, in cross-section;

FIG. 8 shows a third embodiment of a circuit board according to the invention, in cross-section;

FIG. 9 shows, in cross-section, a circuit board of the invention according to an alternative embodiment during assembly;

FIG. 10 shows in a schematic sectional view a detail of a circuit board according to the invention;

FIG. 11 shows an alternative design in a view corresponding to that of FIG. 10;

FIG. 12 shows in a schematic sectional view a further detail of a circuit board according to the invention;

FIG. 13 shows a further detail of a circuit board according to the invention in a view corresponding to that of FIG. 12;

FIGS. 14a to 14c show various steps during manufacturing an individual layer used in the circuit board shown in FIG. 13;

Figure 1:
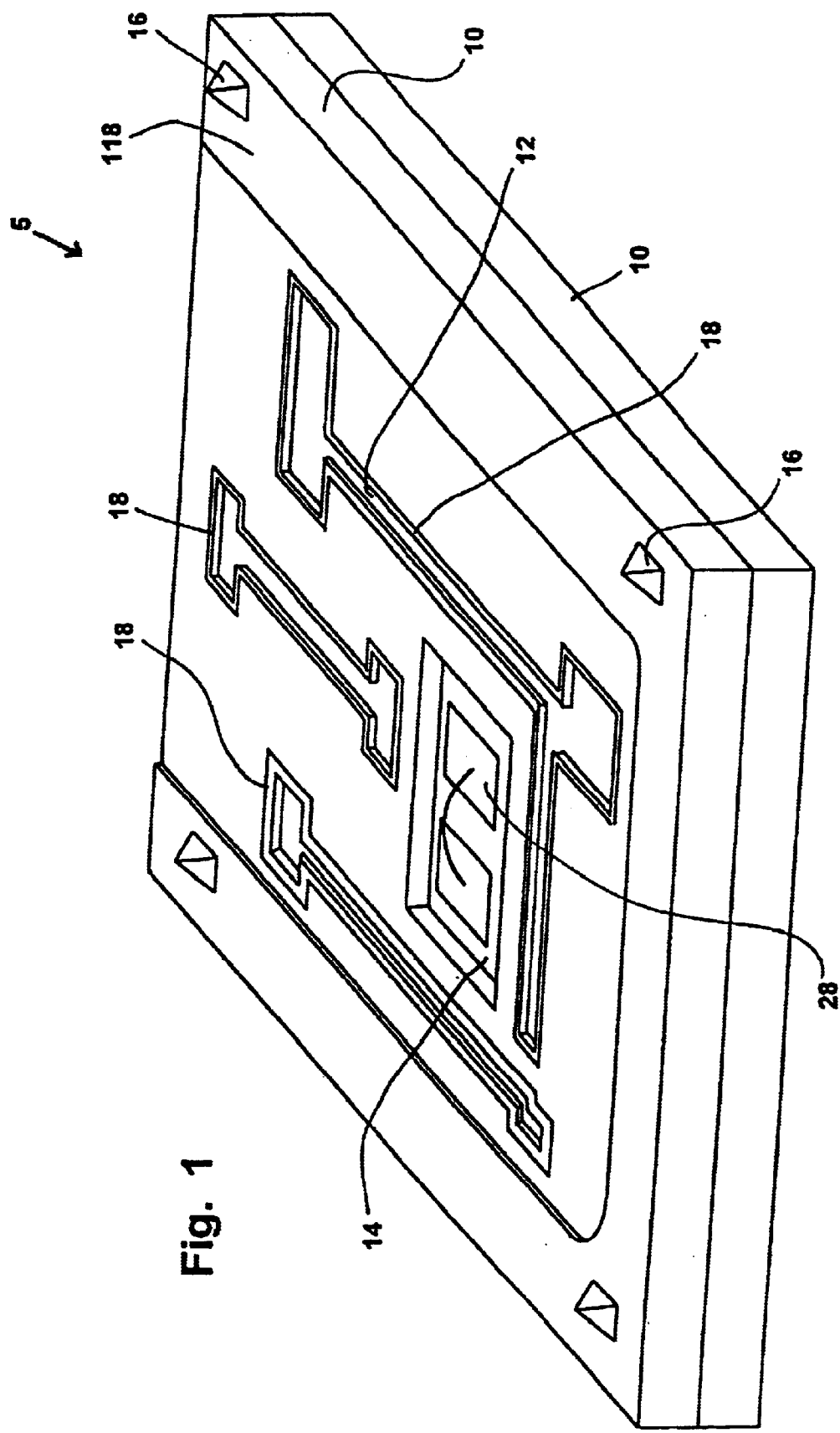
FIG. 1 shows a circuit board according to the invention in a perspective view.

In FIG. 1 there is shown an example of a circuit board 5. It consists of two superimposed individual circuit board layers 10. Each individual layer has two functional sides, that is the upper side and the lower side on which microstructured geometric structures are formed which will be explained in detail hereinbelow. In the circuit board shown in FIG. 1, there are to be seen various conductor trenches 12 on the upper functional side of the upper individual layer 10, which conductor trenches are coated with an electrically conductive material, as well as a mount 14 for two components 28. Positioning formations 18 are also provided which are formed here as pyramid-like protrusions.

In the following, the manufacturing of the individual layers will be described with the aid of FIGS. 2 to 5. In a first step, there is produced an individual layer blank 110 in a thermoplastic formation method from a suitable plastics material. PMMI may be used for example, which is optically transparent. The formation or molding tool used for formation of the individual layer blank 110 is preferably made starting from a masterpiece, which is produced by means of X-ray lithography in the so-called LIGA method. This masterpiece has dimensions and a geometry exactly corresponding to the blank to be produced later, the geometric microstructures being able to be produced with very high accuracy. A formation tool can be produced, starting from the masterpiece, by means of galvanic formation and galvanic copying, if applicable, this tool exactly presenting the microstructures to be formed later.

Figure 2:
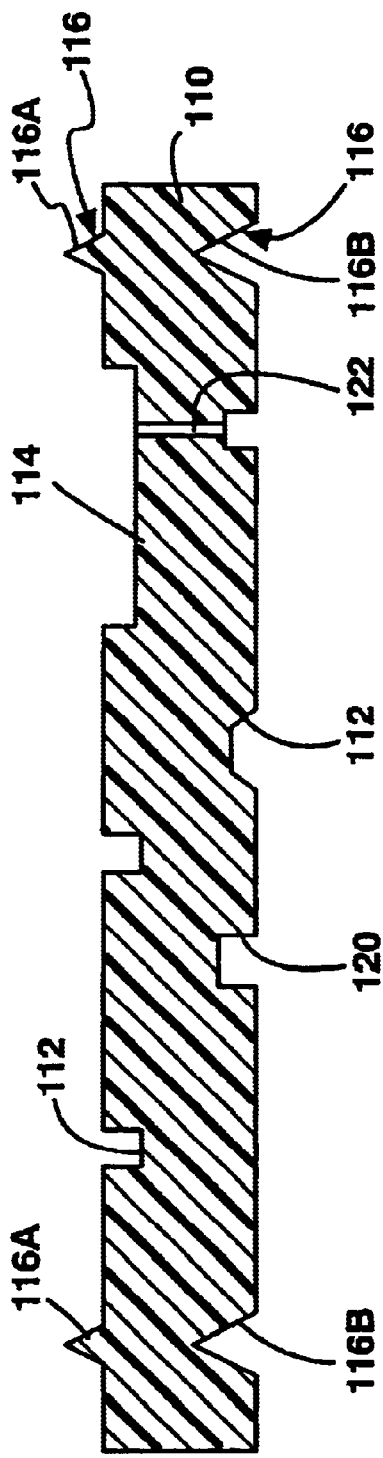
FIG. 2 shows, in a cross-section, a blank of an individual layer which is used in the printed circuit board shown in FIG. 1.

The individual layer blank 110 shown in FIG. 2 and formed from such a formation tool already has, for instance, conductor trench preforms 112, a mount preform 114 as well as positioning formation preforms generally shown at 116, here embodied as depressions 116B and/or protrusions 116A. A cooling groove preform 120 is also provided, the function of which will be described later.

Figure 3:
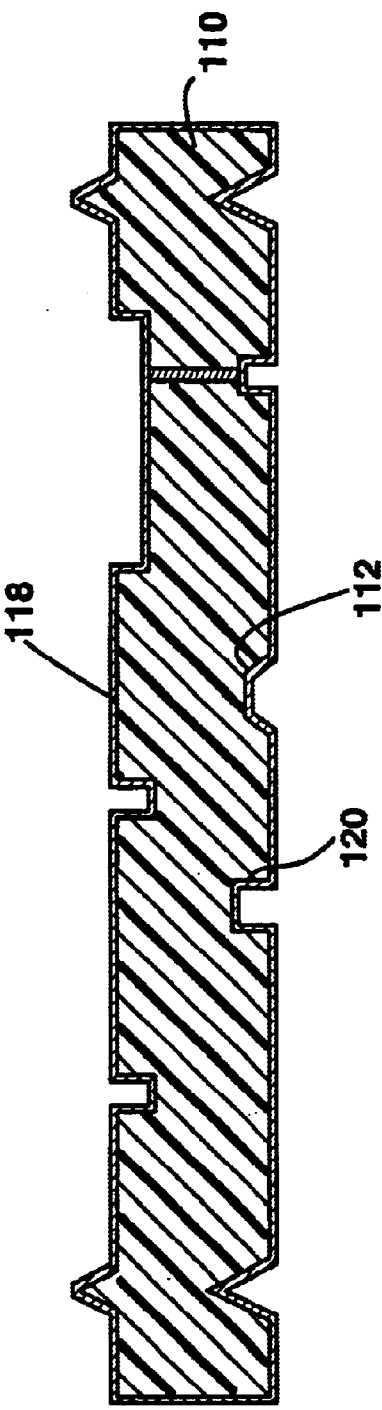
FIG. 3 shows the individual layer blank of FIG. 2 in a first machining condition.

A pretreatment of the entire surface of the individual layer is done in a second step, for applying a thin pre-metallization 118 (see FIG. 3). The pre-metallization can be obtained either by a physical method, in particular vacuum evaporation, or by a chemical method in which the individual layer blank 110 is initially provided with seeds, by it immersing first in a suitable solution, for example a solution of palladium salt, and subsequently in a metallization bath.

The pre-metallization obtained in this way has to be galvanically thickened at a later point in time, so that a layer thickness appears which is sufficient for electrical conducting. In order to ensure that in this way a metallization is obtained only in these regions in which it is in fact desired, the pre-metallization is removed in a subsequent treatment step in these regions in which no metallization is intended to be present at a later point in time. Since all regions of the two functional sides of the individual layer, which later are to be provided with a metallization, are formed so as to be deepened with respect to the surface of the individual layer, for instance as a conductor trench or as a deepened mount, the pre-metallization can be for instance mechanically removed by grinding the entire functional side of the individual layer blank. This can be seen in FIG. 4; the entire underside of the individual layer blank 110 has been ground, so that the pre-metallization has remained only in the conductor trench preforms 112. A complete grinding off on the upper side of the individual layer blank is not possible, because there the positioning formation preforms 116 are present which are formed as a protrusion. It is for this reason that the pre-metallization is ground off here only in a region between the positioning preforms 116 (see FIG. 1).

A chemical subsequent treatment may also be performed as an alternative to mechanically removing the pre-metallization. For instance, the pre-metallization can be etched away in those regions where a metallization is not desired to be at a later point in time. A particularly small amount of material has to be taken away if, in the case of a chemically applied pre-metallization, the subsequent treatment is performed already after dispersing the seeds on the surface, namely prior to applying the pre-metallization proper. In this case only the particularly thin layer of material has to be taken away which has been achieved by the seeding process.

Next, the pre-metallization is galvanically thickened. In the process, differing thicknesses of the metallization can be achieved by applying differing voltages. The finished individual layers having regions with differingly thick metallization is to be seen in FIG. 5. The pre-metallization on the end faces of the individual layer 10 as well as in the region of the positioning formations 16 have not been galvanically thickened. The metallization 18 in the region of the trapezoidal conductor trench 12 on the underside of the individual layer is made so as to have a medium thickness. Compared with this, the metallization 18 of the cooling groove 20 arranged on the underside is made so as to have a particularly large thickness, so that the dissipated heat of a component arranged on the circuit board can be carried away by thermal conduction.

The pre-metallization in the region of the positioning formations may, on the one hand, remain on the individual layer 10, as is shown in FIG. 5; in that case, the thickness of the pre-metallization has to be considered on dimensioning the positioning formations 16, so that the individual layers 10 later are positioned in relation to each other in the desired way, in particular with regard to their mutual spacing. On the other hand, the pre-metallization in the region of the positioning formations may also be removed, after the metallization proper has been applied by galvanic thickening, by shortly immersing the whole individual layer in an acid bath. In so doing, the pre-metallization is rapidly removed due to its small thickness, whilst the thicker metallization proper suffers from the attack by acid only negligibly. In this way, the positioning formations are exposed again, so that the thickness of the pre-metallization appearing during the pretreatment of the individual layer blank has no influence on the later positioning.

In FIG. 6 there is shown an embodiment of a circuit board which consists of two superimposed individual layers. The two individual layers are positioned by an engagement of the protrusions 16A which axe formed on the upper side of the lower individual layer, in the depressions 16B which are formed on the underside of the upper individual layer. In this way there can be arranged, of course, more than two individual layers on top of each other, so that a circuit board is formed which consists of a plurality of individual layers. Only for reasons of better clarity the embodiments described have two individual layers each.

An important aspect with the described positioning of the individual layers relative to each other is that this is a passive positioning, i.e. a positioning in which the precise alignment of the individual layers relative to each other results automatically on placing the one individual layer on top of the other.

In order to make possible an electrical bonding between various functional sides of the individual layers, the individual layers 10 in the embodiment shown in FIG. 6 are provided with a through hole 22 each, which is already formed in the individual layer blank 110 as a through hole preform 122. The through hole preform 122, too, is metallized during the pre-metallization and subsequent galvanic thickening, so that an electrical conductive connection is achieved between the two functional sides of the individual layer 10. On mounting the individual layers to each other an electrical conductive adhesive 24 is used in the region of the through hole 22, 50 that the desired electrical connection is achieved by conductive bonding. As an alternative, a soldering paste could be used.

According to a further development (not shown) the through hole 22 could also be designed to have such a diameter and the metallization deposited there could be configured to have such a wall thickness, that similar to the effect of the cooling groove, a heat removal is possible by thermal conduction between the two functional sides of an individual layer.

In FIG. 7 there is shown a further embodiment of a circuit board. Here, the upper of the two individual layers 10 is provided with two mounts 26 on its underside, in which an electronic, optical or optoelectronic component 28 is arranged. The components 28 do not protrude from the surface of the corresponding individual layer, as they are arranged in the mount 26 so as to be completely embedded therein. For the protection of bonding wires 30, by means of which the components 28 are connected with the metallization 18 in the conductor trenches 12, the lower individual layer 10 is provided with a recess 32 opposite the components.

Since the microstructures for receiving the components 28 are obtained on manufacturing the individual layer 10 by taking a casting from a suitably structured formation tool, each mount 26 is formed very precisely, so that for instance for optical applications or for RF applications a high positioning accuracy of the inserted component in relation to neighbored multifunctional structures can be realized. Basically, components on each stage of manufacturing can be inserted; it is particularly of advantage to use bare chips or dies, because in this case the packing density can be increased by the usual leadframe housing being omitted. The integration of components between the individual layers reduces the bonding expenditure as compared with conventional multi-layered circuit boards, because the components can be inserted laterally and vertically, that is in different planes, so as to be closer to their destination. Thereby the packing density increases and the size decreases.

In FIG. 8 there is illustrated an embodiment in which a cooling channel 34 is provided on the upper side of the lower individual layer, which cooling channel may be used for active cooling the circuit board. Similar to a conductor trench, also the cooling channel 34 is provided with a metallization on its inner side; this metallization, however, is rather a "by-product", because basically all deeper regions of the individual layer are metallized upon manufacturing. The metallization is not necessary for the function of the cooling channel.

In the embodiment shown, the metallization on the underside of the upper individual layer 10 is designed so as to be continuous, so that it lies on the upper side of the lower individual layer 10 and closes off the cooling channel 34. So there is the possibility of guiding a cooling agent 36, for instance water, through the cooling channel 34 whereby large amounts of dissipated heat from the components 28 can be carried away, these components being arranged opposite the cooling groove on the underside of the lower individual layer.

In FIG. 9 there is shown a further embodiment of a circuit board. Unlike the previous embodiments, no protrusions and depressions are used here as positioning formations 16, but instead several openings 16 extending through the respective individual layer from one functional side to the other. The openings 16 are also formed during formation of the individual layers, so that they are arranged with the desired precision and the required accurate alignment in relation to other geometric structures of the individual layer.

Positioning pins 38 are used for positioning the individual layers relative to each other, which pins are pushed into the openings 16 and, because they are conically tapered at their ends, serve for a passive alignment of the individual layers relative to each other.

In FIG. 10 there is shown a detail of a circuit board 5 consisting of two individual layers 10, the features described with the aid of the previous embodiments such as positioning formations or cooling conduits being not shown for the sake of better clarity.

The lower individual layer has a conductor trench 12 which has a rectangular cross-section. A further conductor trench 12 having a semi-circular cross-section is formed on the upper individual layer so as to be opposite the former conductor trench 12. The two conductor trenches are formed on the individual layers so as to be centered with respect to each other, the dimensions of the upper, semi-circular conductor trench being larger than the dimensions of the lower conductor trench. With this, the upper conductor trench 12 bridges over the lower conductor trench, the space between the conductor trenches being filled with air. The two metallized conductor trenches together form a "half" coaxial conductor, the electric and magnetic alternating field being guided in the closed-off cavity filled with air, so that the material properties of the plastic of the individual layers 10 don't matter.

The conductor trench with the semi-circular cross-section may be manufactured by metallizing and polishing, analogous to the procedure described above. The required precise positioning of the two conductor trenches relative to each other is achieved by the positioning formations described.

In FIG. 11 there is illustrated an alternative to the design shown in FIG. 10. In place of the semi-circular cross-section for the upper conductor trench, an elongate rectangular cross-section is used here; the width of the upper conductor trench is a multiple of the width of the lower conductor trench. The upper conductor trench forms a return line which extends "roof-like" over the center conductor; the alignment of the two conductor trenches relative to each other is much less critical in this embodiment. But still there are high demands on the distance between the two conductor trenches; this distance has to be kept very precisely.

RF plugs are necessary for coupling and decoupling RF signals into the RF lines of the circuit board which are shown. A jack or a receiving opening adapted to the jack can be very easily integrated on the edge of the circuit board due to thermoplastic production technology for the individual layers.

According to a further development (not shown), also electrical resonator structures can be produced in the same manner as the RF lines by metallized depressions of an individual layer.

In FIG. 12 there is shown schematically a further embodiment of a circuit board. The lower individual layer 10 is provided with a waveguide 40 here, the latter being formed by a waveguide trench 42 which is filled up with a suitable optically transparent material. Similar to the conductor trench preforms, the waveguide trench 42 is formed already upon formation of the individual layer blank. The lower individual layer has to consist of an optically transparent material for achieving an optimum wave-guiding. This is the case if as material PMMI is used.

The waveguide trench 42 is provided at its ends with reflective end faces. The reflector region is formed so as to be parabolic, so that an improved coupling is achieved in comparison to a flat reflector. The reflector region is selectively metallized, so that mirrors 44 are formed. A metallization in the region of the waveguide conductor trench 42 across the whole area is not possible here, as the optical wave-guiding would be damped too much by metallic boundary surfaces.

Subsequently, the waveguide trench 42 is filled with a liquid core material by known ways and means, which after curing has a higher refraction index than the surrounding material of the lower individual layer 10. In this way there is formed an optical waveguide.

Similar to a previous embodiment, the upper individual layer 10 is provided with mounts 26 for optoelectronic components 28. The component 28 shown on the left-hand side in FIG. 12 can be a VCSEL, the component shown in FIG. 12 on the right-hand side can be a PD. A coupling and decoupling of signals from the transmission and receiving elements is now possible via the mirrors 44.

The arrangement shown makes great demands on the alignment of the two individual layers 10 as well as on the arrangement of the components 28 relative to the waveguide 40 and to the mirrors 44. With a waveguide having a width of only 100 μm, a tolerance is allowed which only amounts to approximately 20 μm, in order to achieve a good optical coupling. These tolerances can be reliably observed, if all structures are formed from a tool which is produced by galvanic copying from a masterpiece, the latter being machined in the X-ray lithography method.

In FIG. 13 there is shown a variant to the embodiment shown in FIG. 12. In place of the parabolic end faces of the waveguide trench which are used in FIG. 12 and by means of which the coupling/decoupling of the light signals is obtained, mirrors 44 are used in the variant of FIG. 13 which are produced as parts which are separate from the lower individual layer 10. In so doing, it is not necessary to carry out a selective metallization of the reflector area. Instead of this, completely metallized plastics platelets (see FIG. 14) can be manufactured with precise outer dimensions, these platelets being inserted in suitable recesses of the lower individual layer at the ends of the waveguide trench 42, analogous to the semiconductor chips of the upper individual layer which constitute the components 28. Here, the mirrors underlie the waveguide trench with an extension so that they are firmly held in the individual layer after the waveguide trench 40 has been formed.

In addition to the waveguide 40 which is shown, there can also be realized integrated optical structures such as optical power splitters or optical star couplers. For this purpose, a suitably designed groove is formed in the corresponding individual layer upon formation. This groove is subsequently filled up with a suitable optically transparent material. The waveguides may also be laid as far as to the edge of the circuit board, so that a plug can be connected there by suitable three-dimensional structures, in order to connect an optical fiber with the printed circuit board, for instance.

A particular advantage of the circuit board described is that by means of the metallization method used electrical conductors can be produced which have a width of approximately 5 μm. By means of the narrow conductor tracks which are possible with this (structure widths of approximately 50 μm are state of the art with conventional circuit boards), the packing density increases and the size decreases.

A further important feature in the circuit boards described is that each individual layer can be separately checked in terms of its electrical function. Thus, only such individual layers are combined into the circuit board, which have passed a functional check. From there results a particularly low reject rate on manufacturing the circuit board, which is drastically reduced as compared to prior art methods.

List of Reference Numbers:
5: circuit board
10: individual layer
12: conductor trench
14: mount
16: positioning formation
18: metallization
20: cooling groove
22: contact opening
24: electrically conductive adhesive
26: mount
28: component
30: bonding wire
32: recess
34: cooling channel
36: cooling agent
38: positioning pin
40: waveguide
42: waveguide trench
44: mirror
110: blank for individual layer
112: conductor trench preform
114: mount preform
116: positioning formation preform
118: pre-metallization
120: cooling groove preform
122: contact opening preform

What is claimed is:

1. A circuit board (5) consisting of at least two individual circuit board layers (10) made of plastics and produced by formation technique, which each have first and second functional sides and at least one microstructured positioning formation (16), said at least one microstructured positioning formation being comprised of at least one projection and at least one recess positioned in interconnecting engagement, said at least one projection being formed on at least one of the first and second functional sides of one of said at least two individual circuit board layers (10), said at least one recess being formed on at least one of the first and second functional sides of another of said at least two individual circuit board layers (10) and positioned in interconnecting engagement with said at least one projection, each of said at least one projection and said at least one recess being formed integrally and simultaneously with one of said at least one individual circuit board layers during formation of said circuit board layers and being formed of material which is the same as the circuit board layer, and at least one microstructured conductor trench (12) on one of the functional sides, the conductor trench (12) being provided with a metallization (18).

2. The circuit board according to claim 1, characterized in that the positioning formation (16) is a protrusion.

3. The circuit board according to claim 2, characterized in that the protrusion (16) is in the shape of a pyramid.

4. The circuit board according to claim 1, characterized in that the positioning formation (16) is a depression.

5. The circuit board according to claim 4, characterized in that the depression (16) is complementary to a pyramid-shaped protrusion.

6. The circuit board according to claim 2, characterized in that each individual layer is provided on one functional side with a plurality of protrusions (16) and on the other functional side with a plurality of depressions (16), the protrusions of the one individual layer engaging into the depressions of the other individual layer, so that the two individual layers are precisely positioned in relation to each other.

7. The circuit board according to claim 1, characterized in that the positioning formation is an opening (16) which extends from the one functional side through the individual layer (10) and as far as to the other functional side.

8. The circuit board according to claim 7, characterized in that a positioning pin (38) is provided which extends through the openings (16) in the individual layers, so that the two individual layer are precisely positioned in relation to each other.

9. The circuit board according to claim 1, characterized in that the conductor trench (12) extends as far as to the edge of the circuit board, so that a plug connector may be connected.

10. The circuit board according to claim 9, characterized in that the conductor trench (12) is semicircular in cross section.

11. The circuit board according to claim 1, characterized in that the conductor trench (12) is rectangular in cross-section.

12. The circuit board according to claim 9, characterized in that a first conductor trench (12) is provided on one of the individual layers (10) and a second conductor trench (12) is provided on the other individual layer (10) and that the two conductor trenches are located centered opposite each other, one of the conductor trenches having smaller dimensions that the other conductor trench.

13. The circuit board according to claim 12, characterized in that the two conductor Wenches (12) extend as far as to the edge of the circuit board (5) and a plug-in connection for an RF line is provided.

14. The circuit board according to claim 13, characterized in that the space between the conductor Wenches (12) located opposite each other is filled with air.

15. The circuit board according to claim 1, characterized in that a cooling groove (20) is provided on at least one of the individual layers, the cooling groove being filled with a metalization (18) of a thickness such that a heat sink is formed.

16. The circuit board according to claim 1, characterized in that a cooling channel (34) is provided on at least one of the individual layers, the cooling channel being adapted for a cooling agent (36) to be conducted therethrough, and that the other individual layer covers the cooling channel.

17. The circuit board according to claim 16, characterized in that the cooling channel extends as far as to the edge of the circuit board (5) and a connection for the cooling agent is formed.

18. The circuit board according to claim 1, characterized in that at least one mount (26) for an electronic, optical or optoelectronic component (28) is provided in at least one of the individual layers.

19. The circuit board according to claim 18, characterized in that a recess (32) located opposite the mount is provided in the other individual layer.

20. The circuit board according to claim 1, characterized in that the two individual layers are connected with each other by an electrically conductive material (24).

21. The circuit board according to claim 20, characterized in that a through hole (22) is provided in at least one of the individual layers (10), the through hole extending from the first functional side through the individual layer (10) and as far as to the second functional side thereof, and that the through hole (22) is filled with an electrically conductive material.

22. The circuit board according to claim 1, characterized in that at least on of the individual layers consists of an optically transparent material and that on this individual layer a waveguide trench (42) is provided which is filled with an optically transparent material the refractive index of which suitably differs from that of the material of the individual layer (10), so that a waveguide (40) is formed.

23. The circuit board according to claim 22, characterized in that the individual layer provided with the waveguide (40) comprises a mirror (44) by means of which light may be coupled into and out of the waveguide.

24. The circuit board according to claim 23, characterized in that the mirror (44) is a separate component which is inserted in the individual layer.

* * * * *